(12) United States Patent
An et al.

(10) Patent No.: US 8,878,233 B2
(45) Date of Patent: Nov. 4, 2014

(54) COMPOUND SEMICONDUCTOR DEVICES AND METHODS OF FABRICATING THE SAME

(75) Inventors: Sung-Jin An, Gyeongbuk (KR); Dong-Gun Lee, Gyeongbuk (KR); Seok-Han Kim, Daegu (KR)

(73) Assignee: LG Siltron Inc., Gyeongsankbuk-do (KR)

(*) Notice: Subject to any disclaimer, the term of this patent is extended or adjusted under 35 U.S.C. 154(b) by 0 days.

(21) Appl. No.: 13/880,706

(22) PCT Filed: Oct. 26, 2011

(86) PCT No.: PCT/KR2011/008009
§ 371 (c)(1),
(2), (4) Date: Apr. 19, 2013

(87) PCT Pub. No.: WO2012/057512
PCT Pub. Date: May 3, 2012

(65) Prior Publication Data
US 2013/0285013 A1 Oct. 31, 2013

(30) Foreign Application Priority Data
Oct. 26, 2010 (KR) .................. 10-2010-0104552

(51) Int. Cl.
*H01L 33/00* (2010.01)
*H01L 33/02* (2010.01)
*H01L 21/02* (2006.01)
*H01L 33/12* (2010.01)
*H01L 21/36* (2006.01)
*H01L 29/06* (2006.01)
*B82Y 40/00* (2011.01)

(52) U.S. Cl.
CPC ............ *H01L 33/02* (2013.01); *H01L 21/0237* (2013.01); *H01L 21/02439* (2013.01); *H01L 21/02444* (2013.01); *H01L 21/02458* (2013.01); *H01L 21/02488* (2013.01); *H01L 21/02502* (2013.01); *H01L 21/0254* (2013.01); *H01L 33/007* (2013.01); *H01L 33/12* (2013.01); *H01L 21/36* (2013.01); *H01L 21/02499* (2013.01); *H01L 21/02104* (2013.01); *H01L 29/06* (2013.01); *B82Y 40/00* (2013.01); *Y10S 977/734* (2013.01)
USPC .................. 257/103; 257/E23.074; 977/734

(58) Field of Classification Search
USPC ............... 257/13, 79, 103, E23.074, E51.038
See application file for complete search history.

(56) References Cited

U.S. PATENT DOCUMENTS 8,409,366 B2 * 4/2013 Ogihara et al. ............... 148/33.4
2009/0146111 A1 * 6/2009 Shin et al. ..................... 252/510

FOREIGN PATENT DOCUMENTS

JP 11-251632 9/1999
JP 2000-068559 3/2000
(Continued)

OTHER PUBLICATIONS

Korean Office Action for KR 10-2010-0104552 mailed Jan. 26, 2010.
(Continued)

*Primary Examiner* — Quoc Hoang
(74) *Attorney, Agent, or Firm* — Lewis Roca Rothgerber LLP

(57) ABSTRACT

Provided are a compound semiconductor device and a manufacturing method thereof. A substrate and a graphene oxide layer are provided on the substrate. A first compound semiconductor layer is provided on the graphene oxide layer. The first compound semiconductor layer is selectively grown from the substrate exposed by the graphene oxide.

10 Claims, 7 Drawing Sheets

(56) References Cited

FOREIGN PATENT DOCUMENTS

| | | |
|---|---|---|
| JP | 2001-057463 | 2/2001 |
| JP | 2002-033512 | 1/2002 |
| JP | 2009-184899 | 8/2009 |
| JP | 2009-259716 | 11/2009 |
| JP | 45-27194 | 8/2010 |
| JP | 2010-232464 | 10/2010 |
| KR | 10-2004-0029165 | 4/2004 |
| KR | 10-2009-0059871 | 7/2009 |
| KR | 10-2010-0042122 | 4/2010 |
| KR | 10-2010-0055098 | 5/2010 |
| KR | 10-2010-0094908 | 8/2010 |
| WO | WO 2010/022164 | 2/2010 |

OTHER PUBLICATIONS

PCT International Search Report for PCT/KR2011/008009 mailed May 24, 2012.

Japanese Application No. 2013-536509, Office Action dated Apr. 22, 2014 (no English Translation).

* cited by examiner

COMPOUND SEMICONDUCTOR DEVICES AND METHODS OF FABRICATING THE SAME

CROSS-REFERENCE TO RELATED APPLICATIONS

The present application is a national phase application of PCT application PCT/KR2011/008009 filed Oct. 26, 2011, which claims the priority benefit of Korean patent application 10-2010-0104552 filed Oct. 26, 2010, the disclosures of which are incorporated herein by reference.

TECHNICAL FIELD

The present disclosure relates to a compound semiconductor device and a method for manufacturing the same.

BACKGROUND ART

A light emitting device such as a light emitting diode (LED) is a kind of a P-N junction diode and is a semiconductor device using an electroluminescence which is a monochromatic light emitting phenomenon when a voltage is applied to forward direction. The wavelength of the light emitted from the light emitting device is determined by the badgap energy (Eg) of a material used. At the beginning of the light emitting device technique, light emitting devices capable of emitting infrared and red light have been developed. Researches on a blue LED has begun in full-scale after founding that a blue light might be generated when using GaN by Nakamura at Nichia Chemistry in 1993. Since white light may be obtained through combining red, green and blue, the development on the GaN-based blue light emitting device along with already developed red and green light emitting devices, enabled the accomplishment of a while light emitting device.

Recently, as the demand on the blue wavelength light emitting device increases, the demand on a GaN thin film is also increased from day to day. In order to increase the efficiency of the light emitting device, various methods have been used.

Among the methods, an epitaxial lateral overgrowth (ELO) method is used to manufacture a nitride semiconductor thin film having high quality and determining inner quantum efficiency. However, the ELO method required complicated processes and a long processing time, including the growth of a buffer layer by an MOCVD method, etc., transferring the buffer layer to an $SiO_2$ deposition apparatus to form an $SiO_2$ thin film, forming an $SiO_2$ pattern by a photolithographic etching process, and inserting into the MOCVD reacting apparatus again to grow a GaN layer.

In addition, since a substrate of the same kind as the GaN thin film is absent, a stress may be generated due to a lattice discrepancy between the GaN thin film and the substrate.

SUMMARY OF THE PRESENTLY CLAIMED INVENTION

Technical Problem

Embodiments provide according to the present inventive concept, a compound semiconductor layer having high quality by a simplified process.

Embodiments also provide according to the present inventive concept, a method of relaxing a stress due to the difference of crystal constants between a substrate and a semiconductor layer.

Solution to the Problem

In one embodiment, a compound semiconductor device is provided. The compound semiconductor device includes a substrate, a graphene oxide layer on the substrate, and a first compound semiconductor layer on the graphene oxide layer.

In an example embodiment, the graphene oxide layer may include a plurality of graphene oxide sheets, and a portion of a surface of the substrate may be exposed between the plurality of the graphene oxide sheets. The first compound semiconductor layer may make a contact with the surface of the substrate exposed between the plurality of the graphene oxide sheets.

A buffer layer may be further included between the substrate and the first compound semiconductor layer. The buffer layer may include at least one of AlN, AlGaN, GaN, InGaN, InN or AlGaInN. A thickness of the buffer layer may be 1 to 200 nm.

In an embodiment, a second compound semiconductor layer may be further included between the substrate and the graphene oxide layer. The graphene oxide layer may include a plurality of graphene oxide sheets, and a portion of a surface of the second compound semiconductor layer may be exposed between the plurality of the graphene oxide sheets.

In an example embodiment, the first compound semiconductor layer may be a nitride semiconductor layer including at least one of AlN, AlGaN, GaN, InGaN, InN or AlGaInN. The substrate may include at least one of sapphire, spinel, GaAs, InP, SiC or Si. The graphene oxide layer may include a plurality of graphene oxide sheets. A longitudinal length of the graphene oxide sheet may be 50 nm to 100 μm, and a thickness of the graphene oxide sheet may be 0.3 nm to 2 μm. The graphene oxide layer may include a functionalized graphene sheet.

In another embodiment, a light emitting device is provided. The light emitting device includes: a substrate; an n-type compound semiconductor layer on the substrate; an active layer on the n-type compound semiconductor layer; a graphene oxide layer provided between the substrate and the active layer, and including a plurality of graphene oxide sheets; and a p-type compound semiconductor layer on the active layer.

In an embodiment, the n-type compound semiconductor layer may include a first semiconductor layer and a second semiconductor layer, and the graphene oxide layer may be provided between the first semiconductor layer and the second semiconductor layer. The graphene oxide layer may be provided between the substrate and the n-type compound semiconductor layer.

In further another embodiment, a method for manufacturing a compound semiconductor device is provided. The method includes: forming a graphene oxide layer including a plurality of graphene oxide sheets on a substrate; and selectively growing a first compound semiconductor layer from an exposed region between the plurality of the graphene oxide sheets.

In an example embodiment, the graphene oxide layer may be formed on a surface of the substrate, and the first compound semiconductor layer may be selectively grown from the substrate exposed between the plurality of the graphene oxide sheets. A buffer layer may be further included between the substrate and the first compound semiconductor layer.

In an example embodiment, the buffer layer may include at least one selected from the group consisting of AlN, AlGaN, GaN, InGaN, InN and AlGaInN, and the forming of the buffer layer may be performed at about 400° C. to about 1,200° C.

In an example embodiment, a second compound semiconductor layer may be further formed between the substrate and the graphene oxide layer. The graphene oxide layer may be formed so as to make a contact with a surface of the second compound semiconductor layer. The first compound semiconductor layer may be selectively grown from a surface of the second compound semiconductor layer exposed between the plurality of the graphene oxide sheets.

In an example embodiment, the forming of the graphene oxide layer may include delaminating the plurality of the graphene oxide sheets from graphite oxide; and coating the plurality of the graphene oxide sheets on the substrate by using at least one method among a spin coating, a Langmuir-Blodgett method, a dip coating, a spray coating, and a drop coating. The selective growth of the first compound semiconductor layer may be performed at about 650° C. to about 1,200° C.

Advantageous Effects of the Invention

According to an example embodiment, a compound semiconductor layer having high quality may be selectively formed by using graphene oxide as a mask.

According to another task of the present inventive concept, there is provided graphene oxide between a substrate and a compound semiconductor layer to control a stress due to the lattice constant difference between the substrate and the compound semiconductor layer.

BRIEF DESCRIPTION OF THE DRAWINGS

FIGS. 17 and 18 are scanning electron microscope photographs of compound semiconductors formed in accordance with example embodiments, in which FIG. 17 is a plan view of a nitride semiconductor, and FIG. 18 is a cross-sectional view thereof.

DETAILED DESCRIPTION

Mode for the Invention

Figure 1:
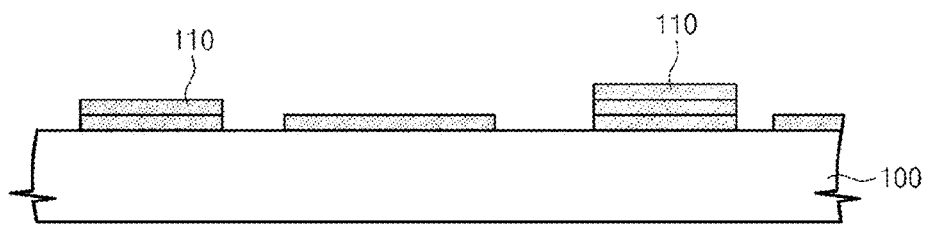
FIGS. 1 to 4 are cross-sectional views for explaining a method of manufacturing a compound semiconductor device in accordance with an example embodiment.

The above objects, other objects, features and advantages will be easily understood through preferred embodiments with reference to accompanying drawings. The invention may, however, be embodied in many different forms and should not be construed as being limited to the embodiments set forth herein. Rather, these embodiments are provided so that this disclosure will be thorough and complete, and will fully convey the concept of the invention to those skilled in the art.

In the specification, it will be understood that when a film (or layer) is referred to as being "on" another film (or layer), it can be directly on or intervening a third film (or layer) may be present. In addition, the sizes or the thicknesses of parts are exaggerated for clarity. In addition, it will be understood that, although the terms first, second, third etc. may be used herein to describe various regions, films (or layers) etc., these regions, films (or layers) should not be limited by these terms. These terms are only used to distinguish one region, or film (or layer) from another region, or film (or layer). Thus, a first layer discussed below could be termed a second layer without departing from the teachings of the present inventive concept. The embodiments explained and illustrated herein may include complementary embodiments thereof.

As used herein, the term "and/or" includes any and all combinations of one or more of the associated listed items. All terms having the same reference numeral used herein have the same meaning.

FIGS. 1 to 4 are cross-sectional views for explaining a compound semiconductor device and a method for manufacturing the same in accordance with an example embodiment.

Referring to FIG. 1, a graphene oxide layer 110 may be formed on a substrate 100. The substrate 100 may be a sapphire, a spinel, a GaAs, an InP, a SiC or a Si substrate. The graphene oxide layer 110 may include a plurality of graphene oxide sheets. Herein, the graphene oxide sheet may refer to graphene oxide pieces constituting the graphene oxide layer. A portion of the surface of the substrate 100 may be exposed between the plurality of the graphene oxide sheets.

The graphene oxide layer 110 may be formed by various methods. For example, graphite is added into sulfuric acid and then, potassium permanganate is slowly added. The temperature is increased to about 35° C., and a Teflon-coated magnetic bar is added to conduct stirring for about 2 hours. Then, a sufficient amount of water is added, and hydrogen peroxide is added until a gas is not generated. Then, graphite oxide is filtered by using a glass filter and then is dried at room temperature for about 12 hours or over under vacuum. Into the dried graphite oxide, an appropriate amount of water is added according to the use and a sonication treatment is conducted to delaminate the graphite oxide and to form graphene oxide sheets. As the time period for the sonication treatment increases, the size of the formed graphene oxide sheets decreases. Differently, in order to control the size of the graphene oxide sheets, the stirring using the Teflon-coated magnetic bar may be conducted slowly to delaminate the graphite oxide. Differently, the graphene oxide sheets may be formed by various known methods. The shape of the graphene sheets may be formless and may have various forms according to the shape of the graphite oxide, the method of the sonication treatment, and the stirring method.

The thus formed graphene oxide sheets as described above may be deposited on the substrate 100 by various methods. For example, the graphene oxide sheets may be coated on the substrate 100 by one method of a spin coating, a Langmuir-Blodgett method, a layer-by-layer method (LBL), a dip coating, a spray coating or a drop coating. In the deposition process, a portion of the graphene oxide layer 110 may be reduced to make a graphene-like structure.

In order to change the chemical properties or the electric properties of the graphene oxide, various functional groups may be added to form a functionalized graphene sheet. The graphene oxide herein may refer to a graphene mono layer as well as few layers of laminated mono layers. In addition, the graphene oxide may refer to a concept including the functionalized graphene sheet.

FIGS. 11 to 14 are scanning electron microscope photographs of substrates on which the graphene oxide layers are formed. In the photographs, black and while portions illustrate the graphene oxide sheets forming the graphene oxide layer 110.

As it goes from FIG. 11 to FIG. 14, the concentration of the graphite oxide per unit medium increases from about 1 μg/ml to about 100 mg/ml. As illustrated in the drawings, as the concentration of the graphite oxide increases, even larger area of the surface of the substrate 100 may be covered with the graphene oxide layer 110. The length of the long axis of the graphene oxide sheets may be about 50 nm to about 100 μm, and the thickness of the graphene oxide sheet is from about 0.3 nm to about 2 μm. The covering ratio of the upper surface of the substrate 100 by the graphene oxide layer 110 may vary from about 10% to about 100%.

Figure 15:
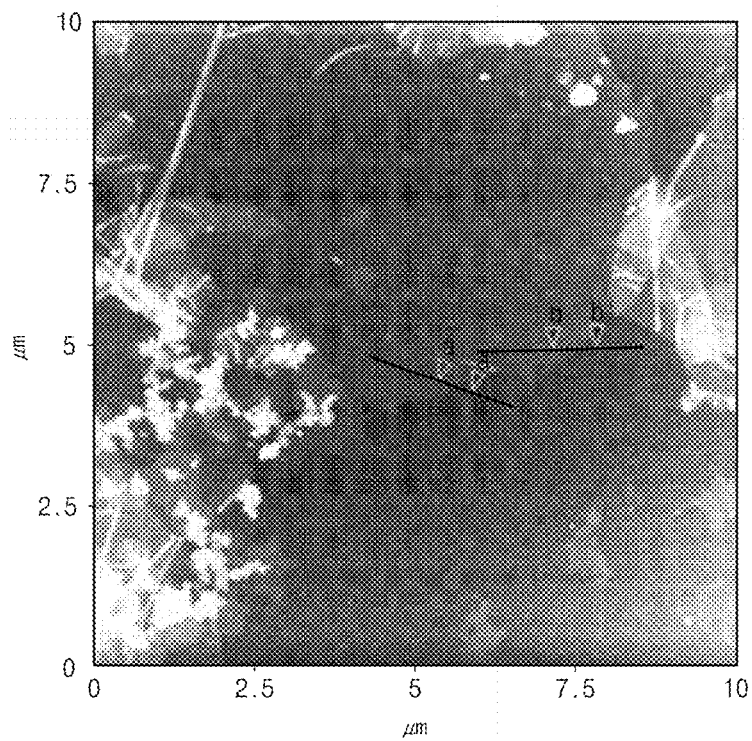
FIG. 15 is an AFM photograph of graphene oxide formed on a substrate.

FIG. 15 is an AFM photograph of the graphene oxide layer 110 formed on the substrate. The thickness of the graphene oxide layer 110 was measured by using AFM. The thickness of the graphene oxide layer 110 when taken along the line a-a' is about 0.3 nm, and the thickness of the graphene oxide layer 110 when taken along the line b-b' is about 1 nm.

The graphene oxide layer 110 may be provided as a specific pattern shape on the substrate 100. That is, the graphene oxide layer 110 may be formed on a portion of the substrate 100, and the graphene oxide layer 110 may not be formed on another region of the substrate 100. In an embodiment, the graphene oxide layer 110 may be provided as a stripe pattern shape on the substrate 100.

The shape of the graphene oxide layer 110, the size and the thickness of the graphene oxide sheets may vary diversely according to the use.

Figure 2:
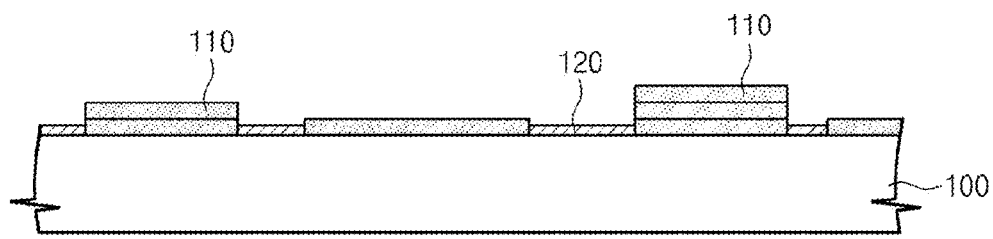
Figure 3:
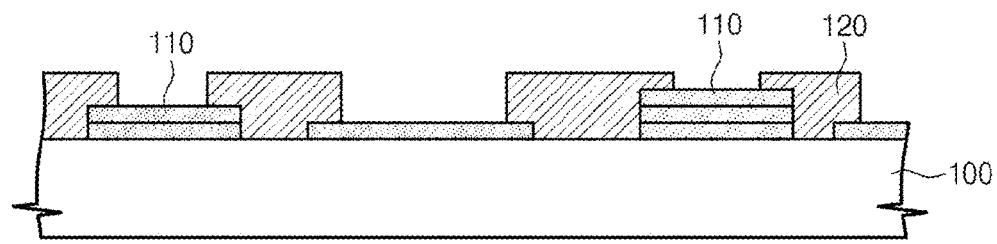
Figure 4:
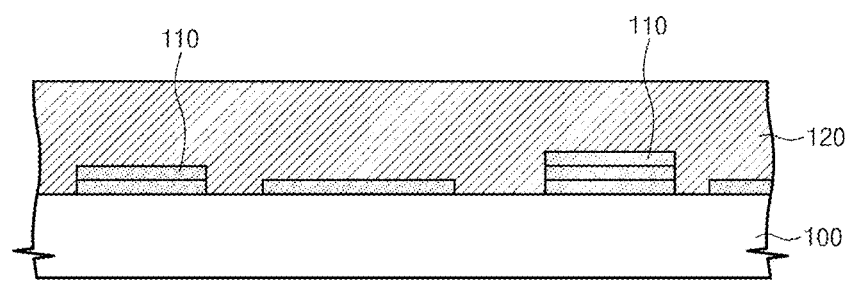

Referring to FIGS. 2 to 4, a first compound semiconductor layer 120 may be formed on the substrate 100 exposed by the graphene oxide layer 110. The first compound semiconductor layer 120 may be a nitride semiconductor layer including at least one of GaN, AlN, InN, AlGaN, InGaN or AlGaInN. The first compound semiconductor layer 120 may be doped with impurity atoms so as to have a certain conductive type. In an embodiment, the first compound semiconductor layer 120 may be an n-type compound semiconductor layer. The first compound semiconductor layer 120 may be doped with various impurity atoms according to the use of the semiconductor layer. For example, at least one atom of Si, Ge, Mg, Zn, O, Se, Mn, Ti, Ni or Fe may be doped. The doping of the impurity atoms may be conducted by an in-situ doping, an ex-situ doping or an ion implantation.

The first compound semiconductor layer 120 may selectively grow while making a contact with the surface of the exposed substrate 100 by using the graphene oxide layer 110 as a mask. For example, the first compound semiconductor layer 120 may be formed by a method among a metal organic chemical vapor deposition (MOCVD), a molecular beam epitaxy (MBE), a liquid phase epitaxy (LPE), a vapor phase epitaxy (VPE), and the like. For example, the growth of the first compound semiconductor layer 120 may be conducted at about 650° C. to about 1,200° C. The first compound semiconductor layer 120 may gradually grow from the surface of the substrate 100 exposed by the graphene oxide layer 110 as illustrated in the drawings. As the process proceeds, the crystals formed from the surface of the exposed substrate may grow laterally and connected to each other to grow into a homogeneous semiconductor layer.

As described above, when the first compound semiconductor layer 120 is formed from a portion of the substrate 100, the number of crystalline defects generated at the beginning of the growth due to the difference of crystal constants may be remarkably decreased. In addition, the lateral growth may be promoted and the dislocations may be also laterally bent to decrease the number of the crystalline defects reaching up to the upper surface of a semiconductor device. The graphene oxide layer 110 may have a high elasticity. Thus, the stress generated due to the difference of lattice constants between the substrate 100 and the first compound semiconductor layer 120 may be relaxed.

FIGS. 5 to 8 are cross-sectional views for explaining a compound semiconductor device and a method for manufacturing the same in accordance with second embodiments. The explanation on the repeated parts will refer to the explanation in the previous embodiment.

Figure 5:
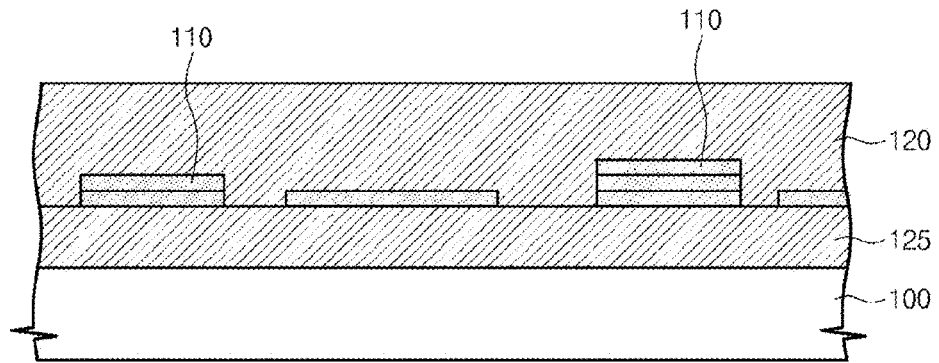
FIGS. 5 to 8 are cross-sectional views for explaining a method of manufacturing a compound semiconductor device in accordance with another example embodiment.

Referring to FIG. 5, a second compound semiconductor layer 125 may be provided between the substrate 100 and the graphene oxide layer 110. In an embodiment, the second compound semiconductor layer 125 may have a thickness of about 1 μm. The second compound semiconductor layer 125 may include the same material as the first compound semiconductor layer 120, but is not limited thereto. The second compound semiconductor layer 125 may have the same conductive-type as the first compound semiconductor layer 120. In an embodiment, the first and second compound semiconductor layers 120 and 125 may be n-type GaN layers. The graphene oxide layer 110 may expose a portion of the surface of the second compound semiconductor layer 125. The first compound semiconductor layer 120 may selectively grow from the surface of the second compound semiconductor layer 125 exposed between the graphene oxide sheets of the graphene oxide layer 110. From the growing process, a plurality of dislocations generated during forming the second compound semiconductor layer 125 may be blocked to decrease the crystalline defects of the first compound semiconductor layer 120.

Figure 6:
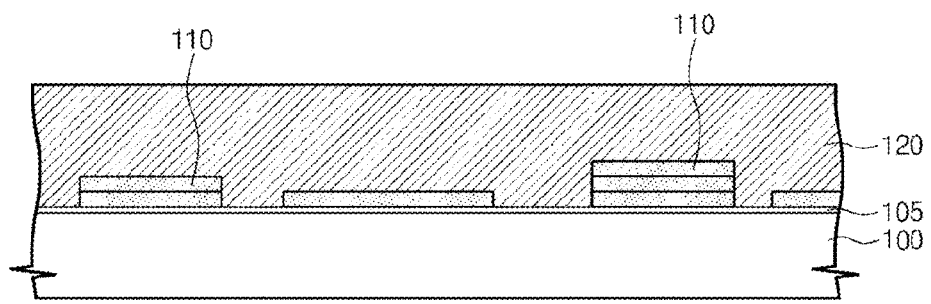
Figure 7:
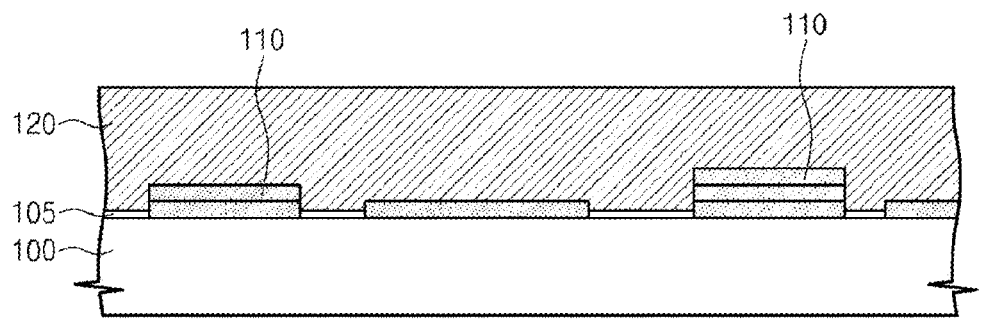

Referring to FIGS. 6 and 7, a buffer layer 105 may be provided between the substrate 100 and the first compound semiconductor layer 120. The buffer layer 105 may decrease the crystalline defects due to the difference of crystal constants between the substrate 100 and the first compound semiconductor layer 120. The buffer layer 105 may include AlN, AlGaN, GaN, InGaN, InN, AlGaInN or a combination thereof. When the buffer layer 105 is an AlN, AlGaN or AlGaInN layer, the buffer layer 105 may be formed at about 400° C. to about 1,200° C. to a thickness of about 1 nm to about 200 nm. When the buffer layer 105 is an InGaN, InN or GaN layer, the buffer layer 105 may be formed at about 400° C. to about 1,000° C. to a thickness of about 1 nm to about 100 nm. When the first compound semiconductor layer 120 is formed on the buffer layer 105, interface energy between the first compound semiconductor layer 120 and the buffer layer 105 may be decreased, and a nuclear formation of a high density may be possible. Thus, semiconductor crystals grown from a plurality of the nuclei may make an interconnection to promote a planar growth. FIG. 6 corresponds to a case when the buffer layer 105 is formed before forming the graphene oxide layer 110, and FIG. 7 corresponds to a case when the buffer layer 105 is provided on the substrate 100 exposed by the graphene oxide layer 110 after forming the graphene oxide layer 110.

Figure 8:
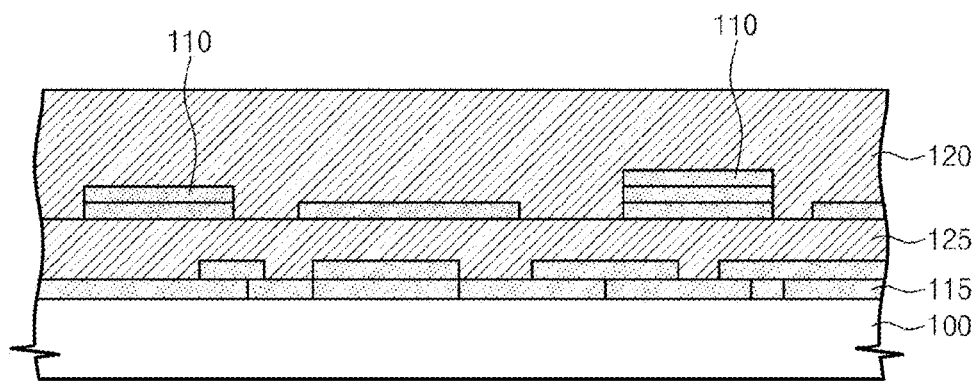

FIG. 8 corresponds to an embodiment in which a second graphene oxide layer 115 is additionally provided between the substrate 100 and the second compound semiconductor layer 125 in the constitution explained in FIG. 4. The second graphene oxide layer 115 may make a contact with the substrate 100 and the second graphene oxide layer 125. The second graphene oxide layer 115 may cover an entire surface of the substrate 100. Due to the high elasticity of the second graphene oxide layer 115, the stress due to the dislocations between the substrate 100 and the second compound semiconductor layer 125 may be relaxed. Different from the drawing, the second graphene oxide layer 115 may expose a portion of the substrate 100 and function as a mask for selective growth along with the first graphene oxide layer 110.

The growing method of a compound semiconductor in accordance with example embodiments may be used in various devices such as an LED, an LD, a high temperature/high output device, an HEMT, an HBT, and the like. Hereinafter, an embodiment of a device formed by the above growing method will be explained. For brief explanation, the explanation on repeated structure will be omitted.

Figure 9:
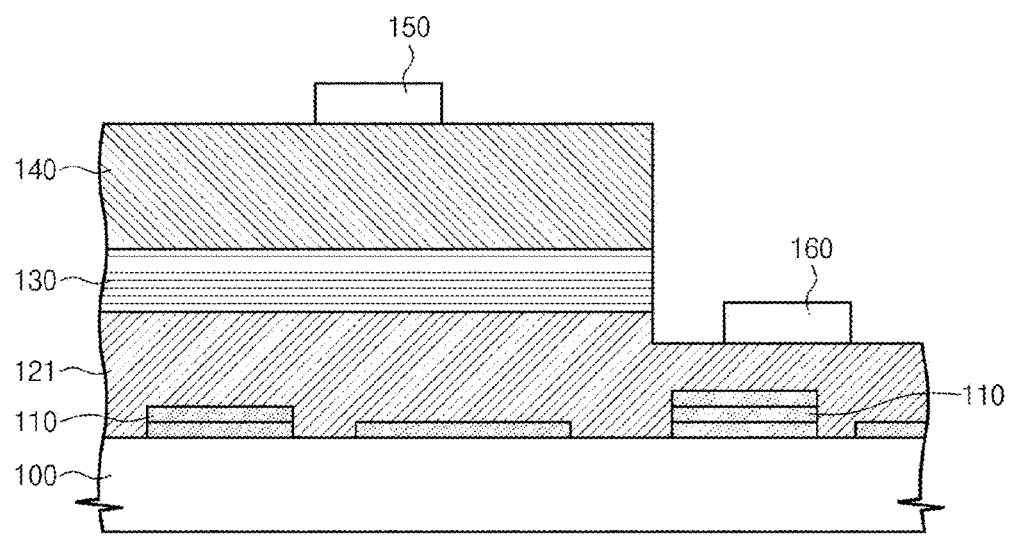
FIGS. 9 and 10 are cross-sectional views of light emitting devices in accordance with example embodiments.
Figure 10:
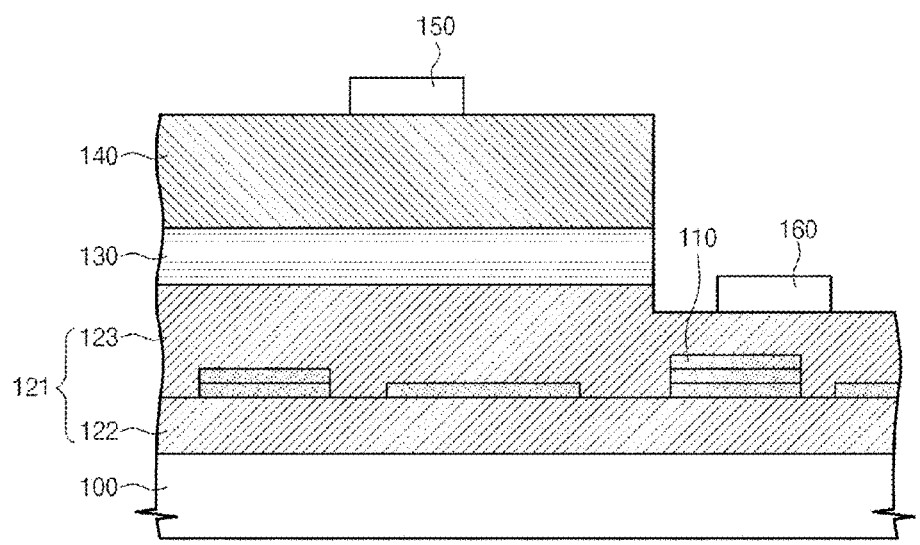
Figure 11:
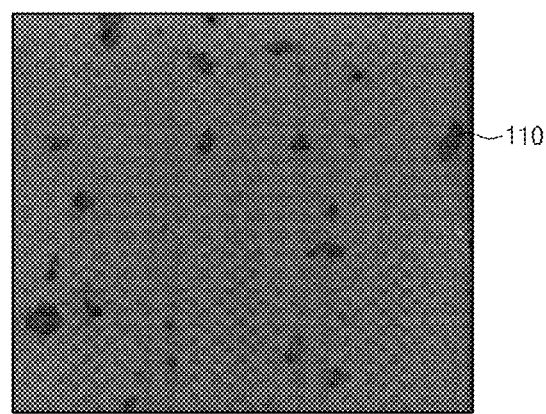
FIGS. 11 to 14 are scanning electron microscope photographs on graphene oxide deposited substrates.
Figure 12:
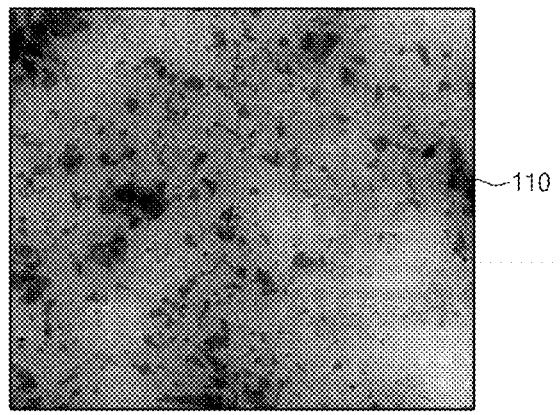
Figure 13:
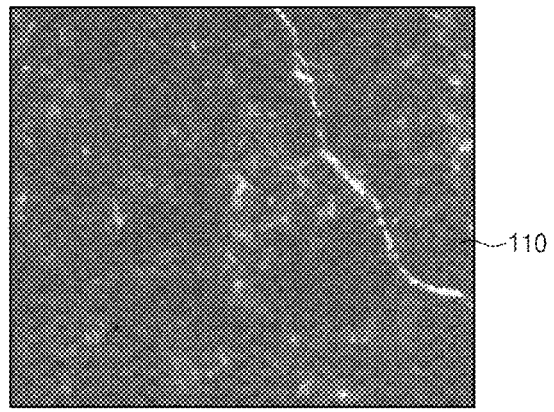
Figure 14:
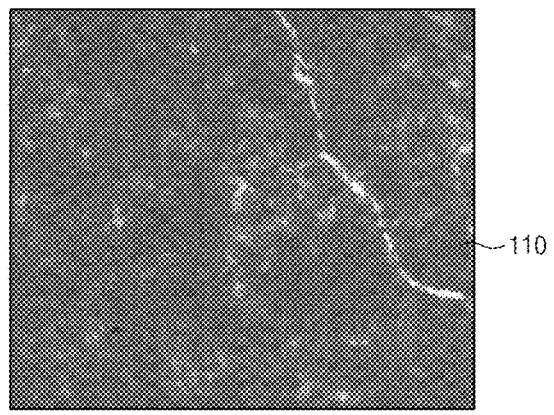

FIGS. 9 and 10 are cross-sectional views of light emitting devices in accordance with the third embodiment. The light emitting device may include an n-type compound semiconductor layer 121, an active layer 130, and a p-type compound semiconductor layer 140 deposited sequentially. In an embodiment, the n-type and p-type compound semiconductor layers 121 and 140 may be n-type or p-type impurity doped GaN layers. As illustrated in FIG. 9, the graphene oxide layer 110 may be provided between the substrate 100 and the n-type compound semiconductor layer 121. As illustrated in FIG. 10, the n-type compound semiconductor layer 121 may include the first semiconductor layer 122 and the second semiconductor layer 123, and the graphene oxide layer 110 may be provided between the first semiconductor layer 122 and the second semiconductor layer 123.

The active layer 130 may include a multi quantum well (MQW) and barrier layers between the multi quantum layers. The multi quantum layers may generate a light by the recombination of electrons and holes. The multi quantum well and the barrier layer may be $In_xGa_{x1-x}N$ ($0 \leq x < 1$) layers having different compositions. The active layer 130 may be formed by a MOCVD, a VPE, or a LPE method. An n-type electrode 160 may be provided on the n-type compound semiconductor layer 121, and a p-type electrode 150 may be provided on the p-type compound semiconductor layer 140. The n-type and p-type electrodes 150 and 160 may be a material including Ni and Au or a material including indium tin oxide (ITO).

The light emitting device in accordance with example embodiments may include decreased crystalline defects because of the graphene oxide layer 110. Thus, the light emitting efficiency of the light emitting device may be improved.

Figure 16:
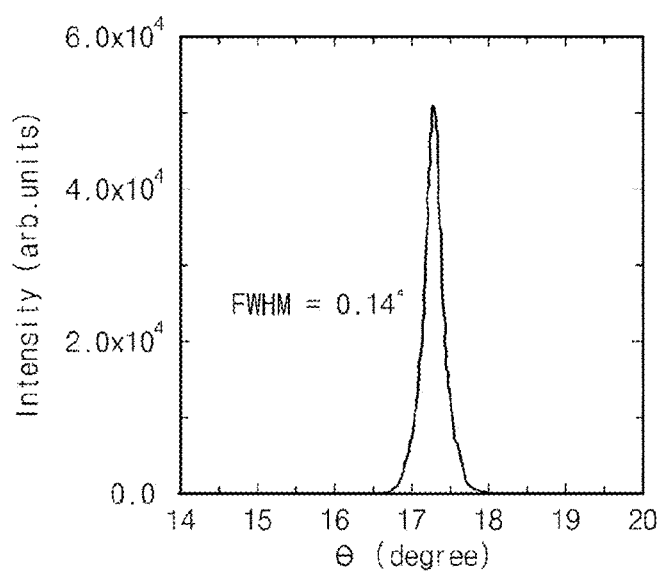
FIG. 16 is an XRD rocking curve of a nitride semiconductor formed in accordance with example embodiments.

FIG. 16 is an XRD rocking curve of a GaN layer formed in accordance with example embodiments. The full width at half maximum (FWHM) of the XRD rocking curve for the GaN layer formed by the selective growth method on the substrate 100 on which the graphene oxide layer 100 is deposited, is about 0.14°, and the quality of the GaN layer formed in accordance with example embodiments is found to be good when compared with a GaN layer formed by a common method.

Figure 17:
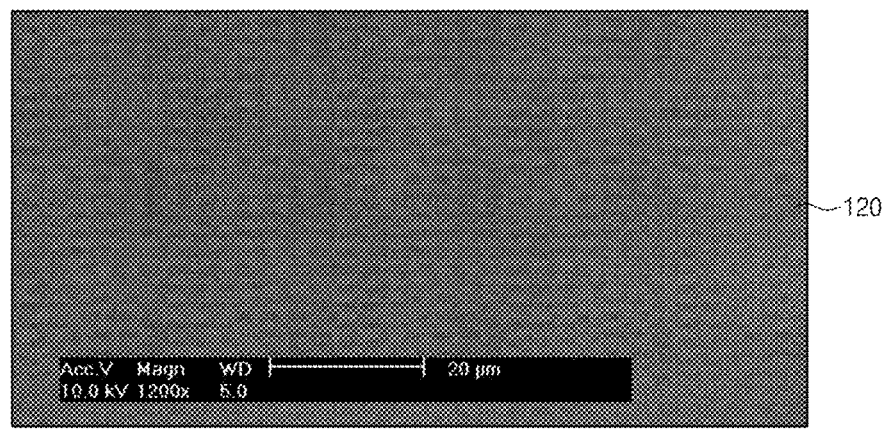
Figure 18:
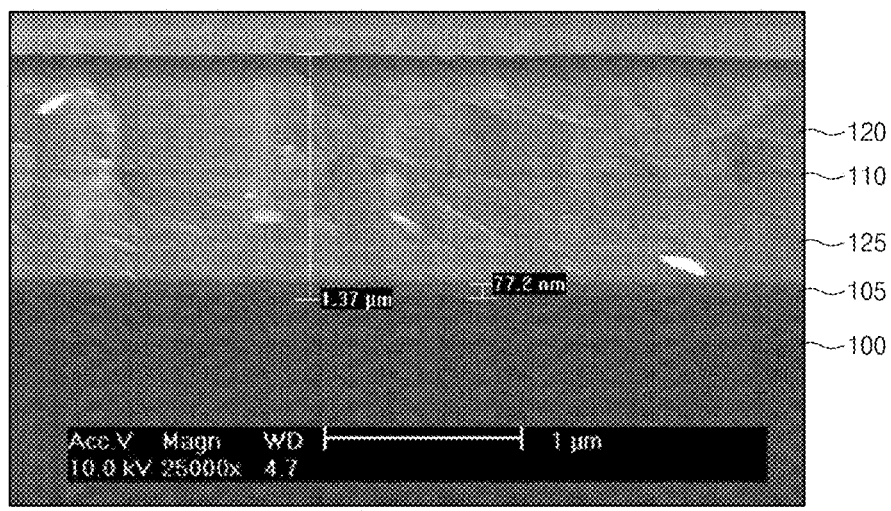

FIGS. 17 and 18 are scanning electron microscope photographs of a nitride semiconductor formed in accordance with an example embodiment, in which FIG. 17 is a plan view of a compound semiconductor and FIG. 18 is a cross-sectional view thereof. A silicon substrate was used as the substrate, and a GaN layer was deposited as the compound semiconductor layer. As illustrated in FIG. 18, a buffer layer 105, a second compound semiconductor layer 125, a graphene oxide layer 110 and a first compound semiconductor layer 120 were formed one by one on the substrate 100. The buffer layer 105 having a thickness of about 77.2 nm was formed on the substrate 100, and the total thickness of the buffer layer 105, the second compound semiconductor layer 125, the graphene oxide layer 110 and the first compound semiconductor layer 120 may be about 1.37 μm. As illustrated in FIG. 17, the surface of the first compound semiconductor layer 120 formed in accordance with example embodiments includes few lattice defects.

Although embodiments have been described with reference to attached drawings, it should be understood that numerous other modifications and embodiments can be devised by those skilled in the art that will fall within the spirit and scope of the principles of this disclosure. Therefore, all of the embodiments described above are illustrative and are not limited.

INDUSTRIAL APPLICABILITY

According to the compound semiconductor device and a method for manufacturing the same, crystalline defects of a semiconductor may be decreased because of a graphene oxide layer. Thus, the light emitting efficiency of a light emitting device by applying thus manufactured semiconductor device may be increased.

The invention claimed is:

1. A compound semiconductor device, comprising:
    a substrate;
    a first graphene oxide layer on the substrate;
    a first compound semiconductor layer on the first graphene oxide layer;
    a second compound semiconductor layer between the substrate and the first graphene oxide layer; and
    a second graphene oxide layer between the substrate and the second compound semiconductor layer, wherein the first graphene oxide layer includes a plurality of graphene sheets, wherein a portion of the second compound semiconductor layer is exposed between the plurality of graphene oxide sheets of the first graphene oxide layer, and wherein the second graphene oxide layer covers an entire surface of the substrate.

2. The compound semiconductor device of claim 1, wherein the first compound semiconductor layer makes a contact with a surface of the portion of the second compound semiconductor layer exposed between the plurality of graphene oxide sheets of the first graphene oxide layer.

3. The compound semiconductor device of claim 1, further comprising:
    a buffer layer between the substrate and the first compound semiconductor layer, the buffer layer including at least one of AlN, AlGaN, GaN, InGaN, InN or AlGaInN.

4. The compound semiconductor device of claim 3, wherein a thickness of the buffer layer is about 1 nm to about 200 nm.

5. The compound semiconductor device of claim 1, wherein the first compound semiconductor layer is a nitride semiconductor layer including at least one of AlN, AlGaN, GaN, InGaN, InN or AlGaInN.

6. The compound semiconductor device of claim 1, wherein the substrate includes at least one of sapphire, spinel, GaAs, InP, SiC or Si.

7. The compound semiconductor device of claim 1, wherein a longitudinal length of the first graphene oxide sheet is about 50 nm to about 100 flm, and a thickness of the first graphene oxide sheet is about 0.3 nm to about 2 flm.

8. The compound semiconductor device of claim 1, wherein the first graphene oxide layer includes a functionalized graphene sheet.

9. A light emitting device, comprising:
    a substrate;
    a first graphene oxide layer on the substrate;
    a first n-type compound semiconductor layer on the first graphene oxide layer;

a second compound semiconductor layer between the substrate and the first graphene oxide layer;
a second graphene oxide layer between the substrate and the second compound semiconductor layer;
an active layer on then-type compound semiconductor layer;
a graphene oxide layer provided between the substrate and the active layer, the graphene oxide layer including a plurality of graphene oxide sheets; and
a p-type compound semiconductor layer on the active layer, wherein the first graphene oxide layer includes a plurality of graphene sheets, wherein a portion of the second compound semiconductor layer is exposed between the plurality of graphene oxide sheets of the first graphene oxide layer, and wherein the second graphene oxide layer covers an entire surface of the substrate.

10. The light emitting device of claim 9, wherein then-type compound semiconductor layer includes a first semiconductor layer and a second semiconductor layer, and the first graphene oxide layer is provided between the first semiconductor layer and the second semiconductor layer.

\* \* \* \* \*